(12) United States Patent
Chong et al.

(10) Patent No.: US 7,521,966 B2
(45) Date of Patent: Apr. 21, 2009

(54) USB 2.0 TRANSMITTER USING ONLY 2.5 VOLT CMOS DEVICES

(75) Inventors: Euhan Chong, Mississauga (CA); Dino A. Toffolon, Stoney Creek (CA)

(73) Assignee: Synopsys, Inc., Mountain View, CA (US)

( * ) Notice: Subject to any disclaimer, the term of this patent is extended or adjusted under 35 U.S.C. 154(b) by 75 days.

(21) Appl. No.: 11/421,318

(22) Filed: May 31, 2006

(65) Prior Publication Data
US 2007/0279096 A1    Dec. 6, 2007

(51) Int. Cl.
*H03K 19/0175* (2006.01)
*H03K 10/094* (2006.01)

(52) U.S. Cl. .............. 326/83; 326/62; 326/82
(58) Field of Classification Search .......... 713/313
See application file for complete search history.

(56) References Cited

U.S. PATENT DOCUMENTS 5,471,175 A * 11/1995 Chiu et al. ............... 330/298
5,512,844 A * 4/1996 Nakakura et al. ........ 326/81
5,543,744 A * 8/1996 Okumura .................. 327/333
6,157,223 A * 12/2000 Blake ....................... 327/108
6,563,352 B1 * 5/2003 Gohel et al. .............. 327/108
6,906,550 B2 * 6/2005 Dreps et al. .............. 326/30

* cited by examiner

*Primary Examiner*—Rexford Barnie
*Assistant Examiner*—Matthew C Tabler
(74) *Attorney, Agent, or Firm*—Bever, Hoffman & Harms, LLP; Patrick T. Bever

(57) ABSTRACT

A USB transmitter 3.3V output stage includes a PMOS cascode transistor connected between a PMOS pullup transistor and a USB port data pin, an NMOS cascode transistor connected between an NMOS pulldown transistor and the data pin, and an output driver circuit that generates a pullup signal range of 0.8V to 3.3V, and a pulldown signal range of 0V to 2.5V, whereby the pullup and pulldown transistors are subjected to 2.5V gate-to-source potentials. A protection/bias circuit biases the PMOS cascode transistor during normal operation such that the pullup resistance matches the pulldown resistance, and turns off the PMOS cascode transistor to shut off the pullup path during a 5V short condition. N-wells of the PMOS pullup and cascade transistors are connected to the 3.3V supply via a resistor.

11 Claims, 2 Drawing Sheets

USB 2.0 TRANSMITTER USING ONLY 2.5 VOLT CMOS DEVICES

BACKGROUND OF THE INVENTION

1. Field of the Invention

The invention relates to the field of computer electronics, and in particular, to a system and method for enabling low-power universal serial bus communications.

2. Related Art

The universal serial bus (USB) protocol is a popular communications protocol that allows a wide range of modern electronic devices and peripherals (e.g., scanners, digital cameras, personal digital assistants, and digital music players) to communicate with another peripheral. The present USB 2.0 specification ("Universal Serial Bus Specification", Revision 2.0, Apr. 27, 2000) defines three signaling levels that can be supported by USB-compliant devices. The three levels include a low-speed mode operating at 1.5 Mbps at 3.3 V, a full-speed mode operating at 12 Mbps at 3.3 V, and a high-speed mode that signals at 480 Mbps at 400 mV.

Modern high-speed USB 2.0-compliant devices include USB transmitters having 3.3V output drivers. For example, FIG. 4 shows a USB transmitter 10, which is part of a first device (apparatus) that generates a USB signal that is transmitted to a second device (not shown) having a USB receiver. A USB cable (not shown) typically connects a USB port 11 on USB transmitter 10 to a corresponding USB port on the USB receiver device (not shown) to enable communication between the two devices.

USB communications utilize a four-line serial data bus that transmits signals between corresponding pins (e.g., pin 12 of USB port 11) of USB transmitter 10 and the non-illustrated USB receiver. Two of these lines are power lines (i.e., VBUS and ground lines), and the other two lines form a pair of differential signal lines (i.e., D+ and D− lines). For clarity, communication signals generated by high-speed USB transmitter 10 will be described herein with reference to only one half of the differential USB signal (i.e., with respect to signal D+, which is transmitted from pin 12). The inverted signal forming the other half of the differential USB signal (i.e., the D− signal) is generated in a manner substantially similar to that described with respect to the generation of the D+ signal.

In accordance with the USB 2.0 specification, data signal D+ is required to have a signal swing of 3.3V in full-speed and low-speed modes (i.e., 0V to 3.3V) and must be 5V tolerant. To meet this requirement, conventional USB transmitter 10 includes an output predriver 13, a 3.3V PMOS pullup transistor 14 and a 3.3V NMOS pulldown transistor 15 that are connected to an output terminal of output predriver 13, and a 45Ω termination (output) resistor $R_{OUT}$, which is connected between pin 11 and the drain terminals of both PMOS pullup transistor 14 and NMOS pulldown transistor 15. Output predriver 13 converts an internal data signal DATA (which typically has a voltage range of 0V to 1.2V) to a pullup/pulldown signal $V_{PU/PD}$ having a voltage range of 0V to 3.3V that is applied the gate terminals of PMOS pullup transistor 14 and NMOS pulldown transistor 15. With this arrangement, depending on the state of pullup/pulldown signal $V_{PU/PD}$, data pin 12 is either pulled up to 3.3V (e.g., when pullup/pulldown signal $V_{PU/PD}$ is 0V) or pulled down to 0V (e.g., when pullup/pulldown signal $V_{PU/PD}$ is 3.3V).

A problem with conventional USB transmitter 10 is that leading edge CMOS fabrication processes (nodes) typically do not support 3.3V devices (i.e., at 65 nm and below the current designs are not portable). Even in fabrication processes where a 3.3V device is supported, it is often used only for USB purposes and hence adds additional mask cost, which increases the overall production costs of USB devices.

One approach to avoiding the use of 3.3V devices in the production of USB devices is to fabricate the pullup and pulldown transistors of USB transmitter 10 using more conventional 2.5V devices. However, simply replacing the 3.3V devices with a 2.5V PMOS pullup transistor 14 and a 2.5V NMOS pulldown transistor 15 subjects these 2.5V devices to stress (e.g., 2.5V PMOS pullup transistor 14 is subjected to a 3.3V gate-to-source voltage when pullup/pulldown signal $V_{PU/PD}$ is 0V, and 2.5V NMOS pulldown transistor 15 is subjected to a 3.3V gate-to-source voltage when pullup/pulldown signal $V_{PU/PD}$ is 3.3V). Even greater stresses are generated during 5V short conditions (i.e., a 5V signal applied to pin 12 from an external source, not shown). Longer gate lengths are required to mitigate device degradation or failure. This approach requires accurate models that account for device degradation over time, and is typically not acceptable to most USB customers.

Accordingly, what is needed is a 3.3V USB transmitter output stage in which the transistors are not subjected to stress-inducing potentials (i.e., greater than 2.5V), even during 5V short conditions, thereby facilitating the use of 2.5V transistors without the risk of damage.

SUMMARY OF THE INVENTION

The present invention is directed to a 3.3V output stage for a USB transmitter that avoids subjecting the transistors to potentials greater than 2.5V, even during a 5V short condition, by utilizing a cascode design approach combined with modified pullup/pulldown signal levels, and cascode biasing that matches pullup and pulldown impedance during normal operation and shuts off the pullup path during a 5V short condition. Because all of the transistor potentials are maintained at 2.5V or less, the present invention facilitates the production of a 3.3V output stage using standard 2.5V transistors, thereby avoiding the complications and added expense associated with the conventional use of non-standard 3.3V transistors.

In accordance with an embodiment of the present invention, the 3.3V output stage of the USB transmitter includes a PMOS cascode transistor connected between a PMOS pullup transistor and a data (output) pin of a USB port, an NMOS cascode transistor connected between an NMOS pulldown transistor and the data pin, and an output driver circuit that generates matching pullup/pulldown signals such that the pullup and pulldown transistors are subjected to 2.5V gate-to-source potentials. In one embodiment a pullup predriver generates the pullup signal with a voltage swing of 0.8V to 3.3V, and a pulldown predriver generates the pulldown signal with a voltage swing of 0V to 2.5V, thereby maintaining the gate-to-source voltages of both the PMOS pullup transistor and the NMOS pulldown transistor at 2.5V. The pullup signal is selected to match the overdrive voltage of the pulldown path, which helps to match the pullup and pulldown impedance.

In accordance with an aspect of the invention, the PMOS cascode transistor and the NMOS cascode transistor serve to limit the voltage across the drain and source of PMOS pullup transistor and NMOS pulldown transistor during a 5V short. In one embodiment, the output stage includes a protection/bias circuit that biases the PMOS cascode transistor during normal operation such that the pullup resistance matches the pulldown resistance, and applies 4.5V to the PMOS cascode transistor during a 5V short condition, thereby completely turning off the PMOS cascode transistor to shut off the pullup path, thereby protecting the 3.3V supply against damage. By shutting off the pullup path using the PMOS cascode transistor during a 5V short, instead of shutting off the PMOS pullup transistor, the 5V short protection function is completely independent from the pullup predriver, which simplifies the output stage circuit because the protection circuit and the pullup predriver will never conflict. Further, this arrangement facilitates a tri-state operating condition when the 5V short is detected, wherein a 3.3V signal is applied to the gate of the PMOS pullup transistor and a 0V signal is applied to the gate of the NMOS pulldown transistor.

In accordance with another aspect of the invention, the N-well of PMOS pullup transistor and PMOS cascode transistor are connected to the 3.3V supply by way of a resistor, and the P-wells of NMOS pulldown transistor and NMOS cascode transistor are connected directly to the ground supply. The N-well resistor limits current during a 5V short.

BRIEF DESCRIPTION OF THE DRAWINGS

These and other features, aspects and advantages of the present invention will become better understood with regard to the following description, appended claims, and accompanying drawings, where:

DETAILED DESCRIPTION

The present invention relates to an improved USB device (apparatus), and in particular to an improved transmitter output stage for a USB device. The following description is presented to enable one of ordinary skill in the art to make and use the invention as provided in the context of a particular application and its requirements. As used herein, the term "connected" is used herein to describe the connective relationship between associated terminals of two circuit elements of an integrated circuit (IC) in which the two terminals are connected by a low resistance conductor (e.g., a metal via, wire, trace or other structure), and is distinguished from the term "coupled", which indicates the presence of zero or more passive or active elements disposed in the current path between the associated terminals. In addition the term "2.5V device" is intended to describe a metal-oxide silicon (MOS) type transistor that is fabricated using a conventional CMOS fabrication process having a nominal operating supply voltage of 2.5V. 2.5V devices are not intended to operate at 3.3V supply voltage. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
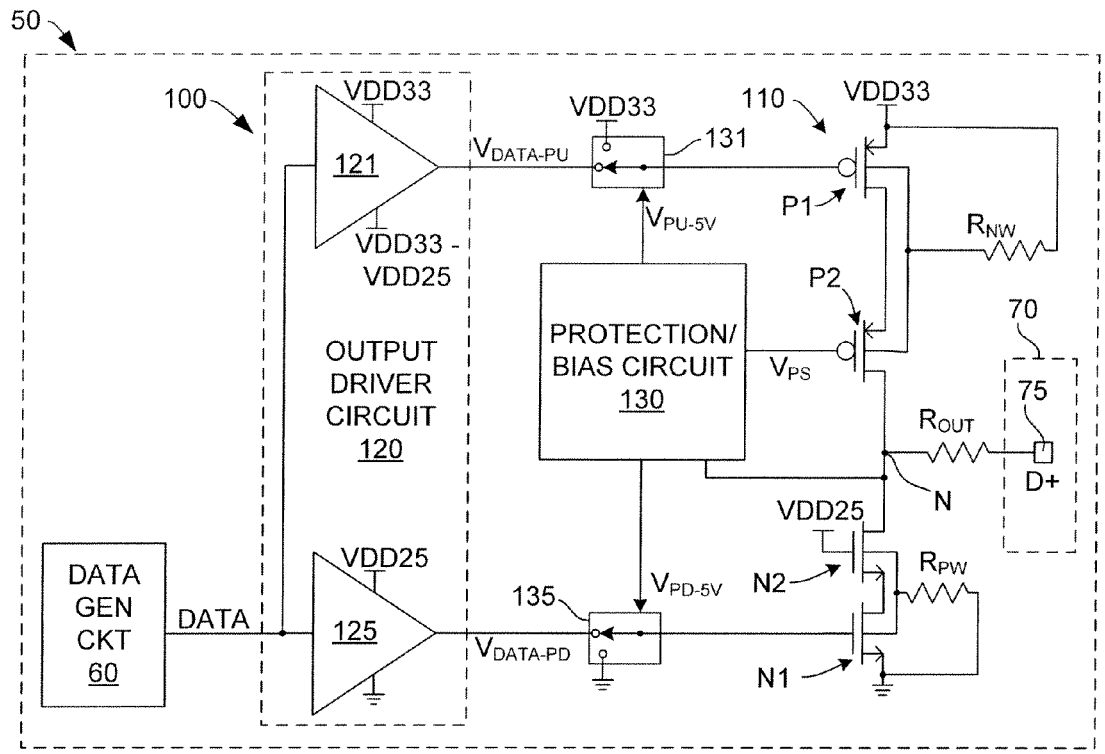
FIG. 1 shows a circuit diagram of a USB apparatus including a transmitter according to an embodiment of the present invention.

FIG. 1 shows a simplified USB apparatus 50 (e.g., a computer, computer peripheral, digital camera, PDA, or digital music player) according to an embodiment of the present invention. Apparatus 50 generally includes a data generation circuit 60 (e.g., a microprocessor or other data processing/generating system) for generating a data signal DATA to be transmitted from a USB port 70, and a USB transmitter 100 for generating a USB signal D+ in response to data signal DATA, and for applying USB signal D+ to an associated data pin 75 of USB port 70.

In accordance with an embodiment of the present invention, USB transmitter 100 includes a 3.3V output stage 110 that is connected to data pin 75, an output driver circuit 120 for controlling the pullup/pulldown operation of output stage 110, and a protection/bias circuit 130. As described above, USB communications are performed using differential signaling, in which half of a differential signal (i.e., USB signal D+) is transmitted via data pin 75, and the other half of the differential signal (i.e., a complementary D− signal) is transmitted over a second pin (not shown) of output port 70. Therefore, each USB port (e.g., output port 70) includes four pins (data D+ pin 75 plus a data D− pin and power and ground pins, not shown). For exemplary purposes, the operation of high-speed USB transmitter 100 is described with respect to the generation of half of the differential USB signal (e.g., the D+ signal). However, it is understood that complementary USB signal generator circuitry included in USB transmitter 100 can generate complementary signal D− forming the other half of the differential USB signal in a manner substantially similar to that described below with respect to the generation of signal D+.

Referring to the right side of FIG. 1, output stage 110 generally includes a PMOS pullup transistor P1 and an NMOS pulldown transistor N1. Consistent with conventional 3.3V output stages, a source terminal of PMOS pullup transistor P1 is connected to a 3.3V (first voltage) supply VDD33, and a source terminal of NMOS pulldown transistor N1 is connected to ground (second voltage supply; 0V). However, unlike conventional USB transmitter 10, output stage 110 further includes a PMOS cascode transistor P2 coupled between PMOS pullup transistor P1 and data (output) pin 75 of USB port 70, and an NMOS cascode transistor N2 coupled between an NMOS pulldown transistor N1 and data pin 75. The source terminal of PMOS cascode transistor P2 is connected to a drain terminal of PMOS pullup transistor P1, and a drain terminal of PMOS cascode transistor P2 is connected to a node N, which is coupled to data pin 75 by way of an output resistor $R_{OUT}$, which by convention is chosen such that the total resistance of the MOS and resistor has a value of 45Ω±10%. The source terminal of NMOS cascode transistor N2 is connected to a drain terminal of NMOS pulldown transistor N1, a drain terminal of NMOS cascode transistor N2 is connected to node N, and a gate terminal connected to a 2.5V supply VDD25.

Referring to the left side of FIG. 1, an output driver circuit 120 receives data signal DATA from data generation circuit 60, and generates a pullup data signal $V_{DATA-PU}$ and a pulldown data signal $V_{DATA-PD}$ that are respectively coupled to the gate terminals of PMOS pullup transistor P1 and NMOS pulldown transistor N1. In accordance with an aspect of the present invention, the pullup data signal $V_{DATA-PU}$ has a voltage range that is different from pulldown data signal $V_{DATA-PD}$. As indicated by pullup predriver circuit 121, depending on the state of data signal DATA, pullup data signal $V_{DATA-PU}$ is either a (first) low voltage level equal to approximately 0.8V (i.e., supply VDD33 minus supply VDD25) or a (first) high voltage level equal to approximately 3.3V (i.e., supply VDD33). In contrast, as indicated by pulldown predriver circuit 125, pulldown data signal $V_{DATA-PD}$ is either a (second) low voltage level equal to approximately 0V (i.e., ground) or a (second) high voltage level equal to approximately 2.5V (i.e., supply VDD25). Accordingly, PMOS pullup transistor P1 receives a higher "high" signal than NMOS pulldown transistor N1 (e.g., 3.3V versus 2.5V), and PMOS pullup transistor P1 receives a higher "low" signal than NMOS pulldown transistor N1 (e.g., 0.8V versus 0V). By utilizing different voltage ranges for pullup data signal $V_{DATA-PU}$ and pulldown data signal $V_{DATA-PD}$, neither PMOS pullup transistor P1 nor NMOS pulldown transistor N1 are subjected to gate-to-source voltage levels in excess of 2.5V during normal operation. That is, because the low voltage level 0.8V is applied to the gate terminal of PMOS pullup transistor P1 (e.g., when data signal DATA is logic 0), the gate-to-source voltage across PMOS pullup transistor P1 is maintained at 2.5V (i.e., VDD33−VDD25). Similarly, because the high voltage level 2.5V is applied to the gate terminal of NMOS pulldown transistor N1 (e.g., when data signal DATA is logic 0), the gate-to-source voltage across NMOS pulldown transistor N1 is maintained at 2.5V (i.e., VDD25). The same gate-to-source voltage potential is applied to the NMOS and PMOS when turning them on (i.e. VDD25), to reduce the mismatch between the PMOS and NMOS 'on' resistance. This helps to maintain the 45Ω output resistance previously described. Therefore, this modified pullup/pulldown signal arrangement facilitates the production of USB transmitter 100 using only low-cost 2.5V devices.

Referring to the middle of FIG. 1, in accordance with another aspect of the invention, protection/bias circuit 130 serves to control PMOS cascode transistor P2 in a way that limits the voltage across the drain and source terminals of PMOS pullup transistor P1 and NMOS pulldown transistor N1 during a 5V short. In one embodiment, protection/bias circuit 130 applies a bias/protection signal $V_{B/P}$ to the gate terminal of PMOS cascode transistor P2 that is approximately 0.8V during normal operation, and is substantially equal to a voltage level generated at node N when, for example, during a 5V short condition, the voltage level at node N is greater than VDD33 (i.e., a bias/protection signal $V_{B/P}$ is equal to the (third high) voltage level simultaneously present at node N). Applying the 0.8V bias signal to the gate of PMOS cascode transistor P2 during normal operation sets the gate-to-source potential to VDD25, thereby further facilitating the fabrication of USB transmitter 100 using 2.5V devices. Applying the 5V protection signal to the gate of PMOS cascode transistor P2, e.g., during a 5V short condition shuts off the pullup path (i.e., from pin 75 to supply VDD33) using the PMOS cascode transistor P2, instead of PMOS pullup transistor P1. Thus, the 5V short protection function is completely independent from pullup predriver 121, which simplifies output stage 110 because protection circuit 130 and pullup predriver 121 will never generate conflicting signals at a particular node (e.g., the gate terminal of PMOS pullup transistor P1). Further, this arrangement facilitates the application of a 3.3V signal to the gate of PMOS pullup transistor P1 (e.g., by way of switch 131 and control signal $V_{PU-5V}$), and a 0V signal to the gate of NMOS pulldown transistor N1 (e.g., by way of switch 135 and control signal $V_{PD-5V}$) when the 5V short is detected.

In accordance with another aspect of the invention, USB transmitter 100 further includes an N-well resistor $R_{NW}$ having a first terminal connected to the N-well regions of PMOS pullup transistor P1 and PMOS cascode transistor P2, and a second terminal connected to supply VDD33, and a PMOS cascode transistor P2, and a second terminal connected to ground. As set forth in the following examples, N-well resistor $R_{NW}$ serves to limit current during a 5V short.

Figure 2:
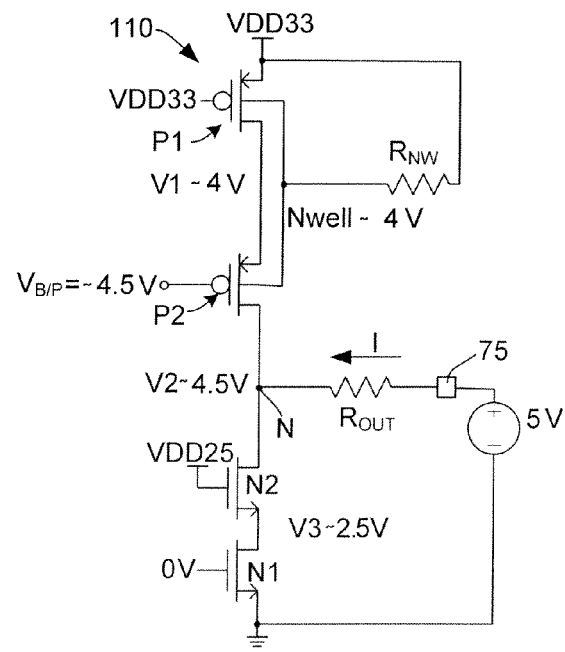
FIG. 2 shows a circuit diagram of a USB transmitter according to the present invention when subjected to a 5V short during a power-up condition.

FIG. 2 depicts output driver 110 during a normal operating condition (i.e., VDD33 is 3.3V) when a 5V short condition occurs (indicated by 5V voltage supply connected to data pin 75). As discussed above, upon detecting the 5V short condition, switches 131 and 135 (FIG. 1) are switched to apply 3.3V to the gate terminal of PMOS pullup transistor P1, and 0V to the gate terminal of NMOS pulldown transistor N1. As discussed above, the bias/protection signal $V_{B/P}$ applied to the gate terminal of PMOS cascode transistor P2 is substantially equal to a voltage level V2 generated at node N, which in this case is approximately 4.5V. Under these conditions, a voltage V1 between the PMOS transistors and the N-well voltage reach approximately 4V, and a voltage V3 between the NMOS transistors reaches approximately 2.5V. Note that the voltage across the drain, gate, and source terminals of all devices is VDD25 or less. VDD25 is commonly defined to be 2.5V+/−10%, and 2.5V devices are designed to operate within this voltage range.

Figure 3:
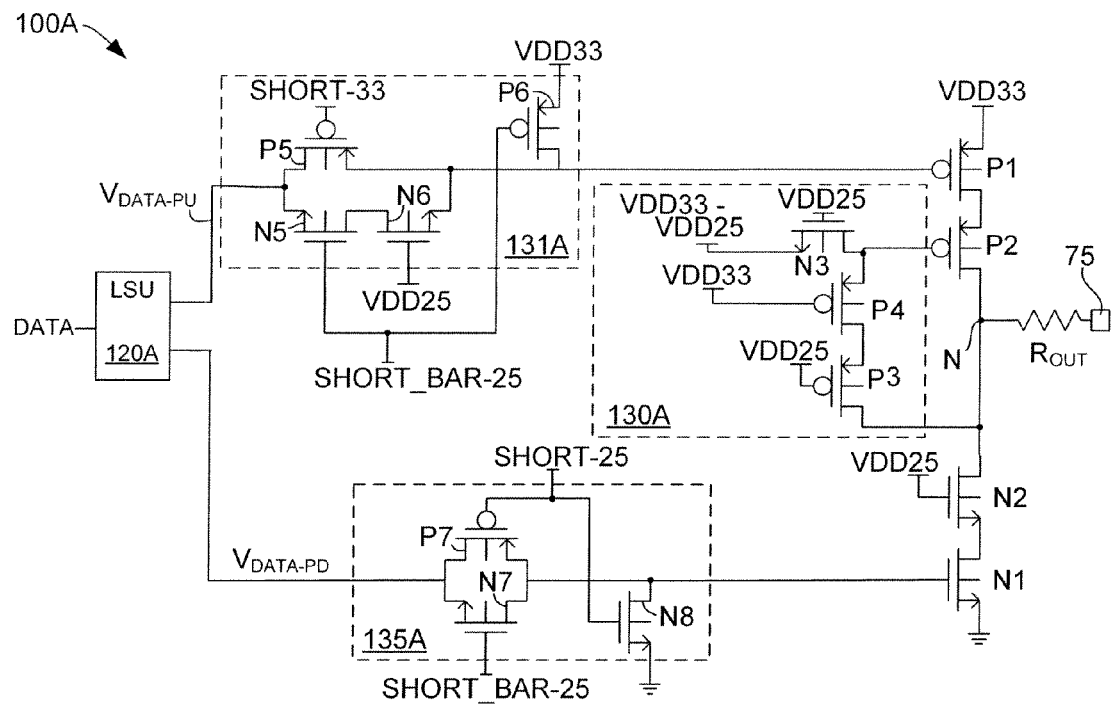
FIG. 3 shows a circuit diagram of a USB transmitter according to another embodiment of the present invention.
Figure 4:
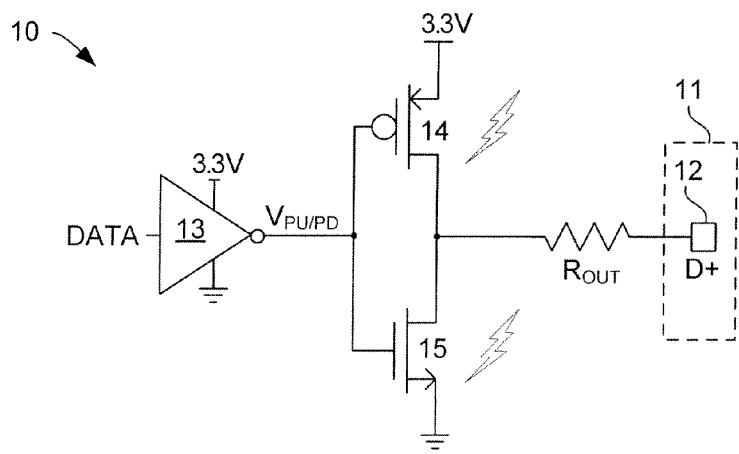
FIG. 4 shows a circuit diagram of a conventional USB transmitter.

FIG. 3 shows a circuit diagram of a USB transmitter 100A including a protection/bias circuit 130A according to a specific embodiment of the present invention (portions of USB transistor 100A are omitted for brevity). In this embodiment a logic shift unit (LSU) 120A is utilized to generate pullup data signal $V_{DATA-PU}$ and pulldown data signal $V_{DATA-PD}$. Protection/bias circuit 130A includes a first PMOS transistor P3 and a second PMOS transistor P4 connected in series between node N and the gate terminal of PMOS cascode transistor P2, and an NMOS transistor N3 connected between a 0.8V reference (VDD33−VDD25) and the gate terminal of PMOS cascode transistor P2. The gate terminal of second PMOS transistor P4 is connected to supply VDD33 and the gate terminal of NMOS transistor N3 is connected to supply VDD25, and the gate terminal of first PMOS transistor P3 is connected to supply VDD25. This arrangement provides 0.8V on the gate terminal of PMOS cascode transistor P2 during normal operation via NMOS transistor N3. Note that 3.3V output voltages at node N are prevented from passing to the gate terminal of PMOS cascode transistor P2 by PMOS transistor P4, and the 2.5V gate voltage on PMOS transistor P3 limits the gate-to-drain voltage on PMOS transistors P3 and P4. During a 5V short condition, PMOS transistors P3 and P4 turn on to pass the voltage level at node N to the gate terminal of PMOS cascode transistor P2, which reaches a maximum of 4.5V during 5V short conditions, as described above. Accordingly, none of the transistors P3, P4 and N3 are subjected to voltage levels greater than 2.5V, thereby facilitating the production of USB transmitter 100A using 2.5V devices.

In accordance with an embodiment, USB transmitter 100A includes a first switch 131A coupled between LSU 120A and the gate terminal of PMOS pullup transistor P1, and a second switch 135A coupled between LSU 120A and the gate terminal of NMOS pulldown transistor N1. Switch 131A includes a PMOS transistor P5 connected between LSU 120A and the gate terminal of PMOS pullup transistor P1, and a PMOS transistor P6 connected between a source terminal of PMOS transistor P5 and 3.3V supply VDD33. Switch 131A also includes NMOS transistors N5 and N6 connected in series between LSU 120A and the gate terminal of PMOS pullup transistor P1. Switch 135A includes a PMOS transistor P7 and an NMOS transistor N7 connected in parallel between LSU 120A and the gate terminal of NMOS pullup transistor N1, an NMOS transistor N8 connected between a drain terminal of NMOS transistor N7 and the ground supply. A digital block (not shown) determines whether a 5V short condition has occurred according to known techniques, and asserts control signals SHORT-25 and SHORT-33 (and de-asserts control signal SHORT_BAR-25) when the 5V short condition is detected. Such digital blocks are known in the art.

During normal operation (i.e., when a 5V short condition is not detected), control signals SHORT-25 and SHORT-33 are de-asserted (0V and 0.8V respectively), and SHORT_BAR-25 is high (2.5V). In switch 131A, the 0V SHORT-33 signal turns on PMOS transistor P5, and the 2.5V SHORT_BAR-25 turns on NMOS transistor N5 and turns off PMOS transistor P6 (NMOS transistor N6 is turned on by 2.5V supply VDD25), thereby passing pullup data signal $V_{DATA-PU}$ to the gate terminal of PMOS pullup transistor P1. Similarly, in switch 135A, the 0V SHORT-25 signal turns on PMOS transistor P7 and turns off NMOS transistor N8, and the 2.5V SHORT_BAR-25 turns on NMOS transistor N7, thereby passing pulldown data signal $V_{DATA-PD}$ to the gate terminal of NMOS pullup transistor N1.

During a 5V short condition, control signal SHORT-25 is 2.5V and SHORT-33 is 3.3V), and SHORT_BAR-25 is 0V). In switch 131A, the 3.3V SHORT-33 signal turns off PMOS transistor P5, and the 0V SHORT_BAR-25 turns off NMOS transistor N5, thereby blocking pullup data signal $V_{DATA-PU}$. In addition, the 0V SHORT_BAR-25 turns on PMOS transistor P6, thereby connecting the gate terminal of PMOS pullup transistor P1 to 3.3V supply VDD33. Similarly, in switch 135A, the 2.5V SHORT-25 signal turns off PMOS transistor P7, and the 0V SHORT_BAR-25 turns off NMOS transistor N7, thereby blocking pulldown data signal $V_{DATA-PD}$. In addition, the 2.5V SHORT-25 signal turns on NMOS transistor N8, thereby connecting the gate terminal of NMOS pullup transistor N1 to ground.

Although the present invention has been described with respect to certain specific embodiments, it will be clear to those skilled in the art that the inventive features of the present invention are applicable to other embodiments as well, all of which are intended to fall within the scope of the present invention. For example, while resistance elements $R_{OUT}$ and $R_{NW}$ are depicted as single resistors for explanatory purposes, in other embodiments, one or more of these resistance elements can comprise multiple resistors connected in parallel (or series) that provide a total resistance equal to 45Ω±10%. Further, while the various voltages discussed herein are exemplary for a 3.3V USB transmitter, features of the present invention may be utilized in transmission circuits operating at other voltages.

The invention claimed is:

1. An apparatus including a universal serial bus (USB) transmitter comprising:
    a USB port including a data pin;
        a PMOS pullup transistor having a first terminal connected to a first voltage supply, and a second terminal coupled to the data pin;
        first means for transmitting a pullup data signal to a gate terminal of the pullup transistor such that the pullup data signal is one of a first low voltage level and a first high voltage level;
        an NMOS pulldown transistor having a first terminal connected to a second voltage supply and a second terminal coupled to the data pin; and
        second means for transmitting a pulldown data signal to a gate terminal of the pulldown transistor such that the pullup data signal is one of a second low voltage level and a second high voltage level,
    wherein the first low voltage level is greater than the second low voltage level,
    wherein the first high voltage level is greater than the second high voltage level,
    wherein the USB transmitter further comprises a PMOS cascode transistor coupled between the second terminal of the PMOS pullup transistor and the data pin, and
    wherein the USB transmitter further comprises bias/protection means for applying a bias/protection signal to a gate terminal of the PMOS cascode transistor during normal operation, and for passing a third high voltage level from the data pin to a gate terminal of the PMOS cascode transistor when the third high voltage level is greater than the first high voltage level.

2. The apparatus of claim 1,
    wherein each of the NMOS pulldown transistor and the PMOS pullup transistor comprise 2.5V transistors,
    wherein the first low voltage level is equal to the first high voltage level minus the second high voltage level,
    wherein the first high voltage level is approximately 3.3V,
    wherein the second low voltage level is approximately 0V, and
    wherein the second high voltage level is approximately 2.5V.

3. The apparatus of claim 1, wherein said bias/protection means comprises:
    a first PMOS transistor having a drain terminal connected to the drain terminal of the PMOS cascode transistor and a gate terminal connected to receive the second high voltage level; and
    a second PMOS transistor having a drain terminal connected to a source terminal of the first PMOS transistor, a gate terminal connected to the first voltage supply, and a source terminal connected to the gate terminal of the PMOS cascode transistor.

4. The apparatus of claim 3, wherein said bias/protection means further comprises an NMOS transistor having a source terminal connected to receive the first low voltage level, a gate terminal connected to receive the second high voltage level, and a drain terminal connected to the gate terminal of the PMOS cascode transistor.

5. The apparatus of claim 1, wherein the USB transmitter further comprises switch means for coupling the gate terminal of the pullup transistor to the first voltage supply and for coupling the gate terminal of the pulldown transistor to the second voltage supply when a 5V short is applied to the data pin.

6. The apparatus of claim 1, wherein the USB transmitter further comprises an N-well resistor having a first terminal connected to an N-well region of the PMOS pullup transistor and an N-well region of the PMOS cascode transistor, and a second terminal connected to the first voltage supply.

7. The apparatus of claim 6, further comprising an output resistor connected between the PMOS cascode transistor and the data pin, wherein the total output resistance is approximately 45-ohms.

8. The apparatus of claim 1, wherein the USB transmitter further comprises an NMOS cascode transistor coupled between the second of the pullup transistor and the data pin.

9. The apparatus of claim 8, wherein a gate terminal of the NMOS cascode transistor is connected to a third voltage supply that is maintained at the second high voltage level.

10. The apparatus of claim 9, further comprising an output resistor connected between the NMOS cascode transistor and the data pin, wherein the total output resistance is approximately 45-ohms.

11. An apparatus including:
    a universal serial bus (USB) port including a data pin; and
    a USB transmitter comprising:
        a PMOS pullup transistor having a first terminal connected to a first voltage supply, a gate terminal connected to receive a pullup control signal, and a second terminal;
        a PMOS cascode transistor connected between the second terminal of the PMOS pullup transistor and the data pin;

an NMOS pulldown transistor having a first terminal connected to a second voltage supply, a gate terminal connected to receive a pulldown control signal, and a second terminal; and an NMOS cascode transistor connected between the second terminal of the pullup transistor and the data pin; and means for applying a protection signal to a gate terminal of the PMOS cascode transistor during normal operation, and for passing a third high voltage from the data pin to a gate terminal of the PMOS cascode transistor when the third high voltage is greater than the first supply voltage.

* * * * *